US009818728B2

(12) United States Patent
Chandolu

(10) Patent No.: US 9,818,728 B2
(45) Date of Patent: Nov. 14, 2017

(54) INTERCONNECT STRUCTURE WITH REDUNDANT ELECTRICAL CONNECTORS AND ASSOCIATED SYSTEMS AND METHODS

(71) Applicant: Micron Technology, Inc., Boise, ID (US)

(72) Inventor: Anilkumar Chandolu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/162,209

(22) Filed: May 23, 2016

(65) Prior Publication Data

US 2016/0268235 A1 Sep. 15, 2016

Related U.S. Application Data

(62) Division of application No. 14/287,418, filed on May 27, 2014, now Pat. No. 9,356,009.

(51) Int. Cl.
*H01L 23/49* (2006.01)
*H01L 25/065* (2006.01)
(Continued)

(52) U.S. Cl.
CPC .......... *H01L 25/0657* (2013.01); *H01L 21/56* (2013.01); *H01L 21/76898* (2013.01); *H01L 23/481* (2013.01); *H01L 24/02* (2013.01); *H01L 24/11* (2013.01); *H01L 24/13* (2013.01); *H01L 24/14* (2013.01); *H01L 24/17* (2013.01); *H01L 24/81* (2013.01); *H01L 25/18* (2013.01); *H01L 25/50* (2013.01); *H01L 23/3128* (2013.01); *H01L 23/3675* (2013.01); *H01L 23/49816* (2013.01); *H01L 24/05* (2013.01); *H01L 24/16* (2013.01); *H01L 24/32* (2013.01); *H01L 2224/0239* (2013.01);
(Continued)

(58) Field of Classification Search
None
See application file for complete search history.

(56) References Cited

U.S. PATENT DOCUMENTS 6,468,894 B1 10/2002 Yang et al.
6,841,438 B2 1/2005 Bissey et al.
(Continued)

OTHER PUBLICATIONS

Office Action dated May 10, 2016 in Taiwan Application No. 104117024, 19 pages.
(Continued)

*Primary Examiner* — Michael Lebentritt
(74) *Attorney, Agent, or Firm* — Perkins Coie LLP

(57) ABSTRACT

Semiconductor die assemblies having interconnect structures with redundant electrical connectors are disclosed herein. In one embodiment, a semiconductor die assembly includes a first semiconductor die, a second semiconductor die, and an interconnect structure between the first and the second semiconductor dies. The interconnect structure includes a first conductive film coupled to the first semiconductor die and a second conductive film coupled to the second semiconductor die. The interconnect structure further includes a plurality of redundant electrical connectors extending between the first and second conductive films and electrically coupled to one another via the first conductive film.

18 Claims, 13 Drawing Sheets

(51) Int. Cl.
*H01L 23/00* (2006.01)
*H01L 25/18* (2006.01)
*H01L 25/00* (2006.01)
*H01L 21/768* (2006.01)
*H01L 23/48* (2006.01)
*H01L 21/56* (2006.01)
H01L 23/367 (2006.01)
H01L 23/31 (2006.01)
H01L 23/498 (2006.01)

(52) U.S. Cl.
CPC ........... *H01L 2224/02371* (2013.01); *H01L 2224/02372* (2013.01); *H01L 2224/0401* (2013.01); *H01L 2224/05548* (2013.01); *H01L 2224/05647* (2013.01); *H01L 2224/1145* (2013.01); *H01L 2224/1147* (2013.01); *H01L 2224/11462* (2013.01); *H01L 2224/131* (2013.01); *H01L 2224/133* (2013.01); *H01L 2224/13024* (2013.01); *H01L 2224/1329* (2013.01); *H01L 2224/13083* (2013.01); *H01L 2224/13084* (2013.01); *H01L 2224/13111* (2013.01); *H01L 2224/13147* (2013.01); *H01L 2224/13155* (2013.01); *H01L 2224/13164* (2013.01); *H01L 2224/13565* (2013.01); *H01L 2224/13647* (2013.01); *H01L 2224/1411* (2013.01); *H01L 2224/14181* (2013.01); *H01L 2224/16113* (2013.01); *H01L 2224/16145* (2013.01); *H01L 2224/17107* (2013.01); *H01L 2224/17181* (2013.01); *H01L 2224/32225* (2013.01); *H01L 2224/32245* (2013.01); *H01L 2224/73253* (2013.01); *H01L 2224/81193* (2013.01); *H01L 2224/81815* (2013.01); *H01L 2224/8385* (2013.01); *H01L 2224/83424* (2013.01); *H01L 2224/83447* (2013.01); *H01L 2224/83455* (2013.01); *H01L 2224/83487* (2013.01); *H01L 2225/06513* (2013.01); *H01L 2225/06517* (2013.01); *H01L 2225/06541* (2013.01); *H01L 2225/06544* (2013.01); *H01L 2225/06555* (2013.01); *H01L 2225/06582* (2013.01); *H01L 2225/06589* (2013.01); *H01L 2924/1033* (2013.01); *H01L 2924/10253* (2013.01); *H01L 2924/14* (2013.01); *H01L 2924/1431* (2013.01); *H01L 2924/1434* (2013.01); *H01L 2924/1436* (2013.01); *H01L 2924/1437* (2013.01); *H01L 2924/15311* (2013.01); *H01L 2924/16235* (2013.01); *H01L 2924/16251* (2013.01)

(56) References Cited

U.S. PATENT DOCUMENTS

| | | | |
|---|---|---|---|
| 6,884,707 | B1 | 4/2005 | Cherian et al. |
| 7,541,217 | B1 | 6/2009 | Shih et al. |
| 7,659,612 | B2 | 2/2010 | Hembree et al. |
| 7,759,161 | B2 | 7/2010 | Tanaka et al. |
| 7,900,347 | B2 | 3/2011 | Rathburn et al. |
| 7,935,573 | B2 * | 5/2011 | Mizukoshi ............ H01L 23/041 257/678 |
| 8,330,272 | B2 * | 12/2012 | Haba .................. H01L 21/4853 257/697 |
| 2003/0063450 | A1 | 4/2003 | Miller |
| 2004/0101663 | A1 | 5/2004 | Agarwala et al. |
| 2006/0012049 | A1 | 1/2006 | Lin et al. |
| 2006/0014376 | A1 | 1/2006 | Agarwala et al. |
| 2006/0186906 | A1 | 8/2006 | Bottoms et al. |
| 2007/0228549 | A1 | 10/2007 | Hsu |
| 2009/0001602 | A1 | 1/2009 | Chung et al. |
| 2009/0091026 | A1 | 4/2009 | Fan |
| 2009/0243121 | A1 | 10/2009 | Ito et al. |
| 2010/0096760 | A1 | 4/2010 | Yu et al. |
| 2011/0095418 | A1 | 4/2011 | Lim et al. |
| 2013/0037879 | A1 | 2/2013 | Filippini et al. |
| 2013/0069230 | A1 | 3/2013 | Vodrahalli |
| 2013/0134582 | A1 | 5/2013 | Yu et al. |

OTHER PUBLICATIONS

International Search Report dated Aug. 27, 2015 in International App. No. PCT/US2015/032216, 18 pages.

* cited by examiner

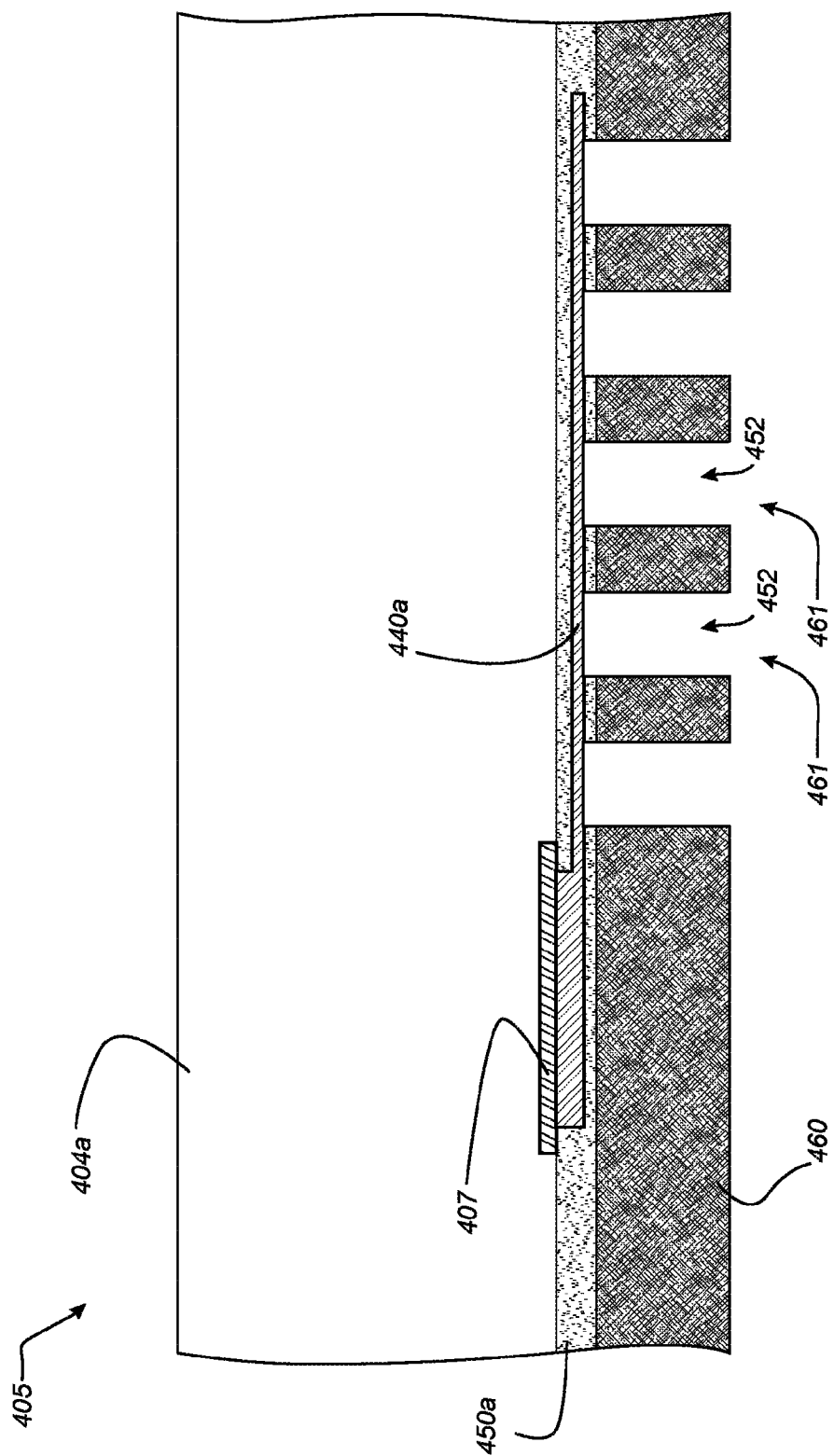

INTERCONNECT STRUCTURE WITH REDUNDANT ELECTRICAL CONNECTORS AND ASSOCIATED SYSTEMS AND METHODS

CROSS-REFERENCE

This Application is a divisional of U.S. patent application Ser. No. 14/287,418, filed May 27, 2014, now U.S. Pat. No. 9,356,009, which is incorporated herein by reference in its entirety.

TECHNICAL FIELD

The disclosed embodiments relate to interconnect structures formed between stacked semiconductor dies in a semiconductor die assembly. In several embodiments, the present technology relates to an interconnect structure having redundant conductive electrical connectors.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to external circuitry.

Within some die packages, semiconductor dies can be stacked upon and electrically connected to one another by interconnects placed between adjacent dies. The interconnects can be connected to the bond pads of adjacent dies with metal solder. One challenge with metal solder bonding, however, is that the metal solder does not always bond properly to the interconnects and/or the bond pads. As a result, the interconnects may be open circuited, which can cause the die package to not function properly. This, in turn, can reduce process yield during manufacturing.

BRIEF DESCRIPTION OF THE DRAWINGS

FIGS. 4A-4H are cross-sectional views illustrating a semiconductor device at various stages in a method for making interconnect structures in accordance with selected embodiments of the present technology.

DETAILED DESCRIPTION

Specific details of several embodiments of stacked semiconductor die assemblies having interconnect structures with redundant electrical connectors and associated systems and methods are described below. The terms "semiconductor device" and "semiconductor die" generally refer to a solid-state device that includes semiconductor material, such as a logic device, memory device, or other semiconductor circuit, component, etc. Also, the terms "semiconductor device" and "semiconductor die" can refer to a finished device or to an assembly or other structure at various stages of processing before becoming a finished device. Depending upon the context in which it is used, the term "substrate" can refer to a wafer-level substrate or to a singulated, die-level substrate. A person skilled in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-5.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations.

Figure 1:
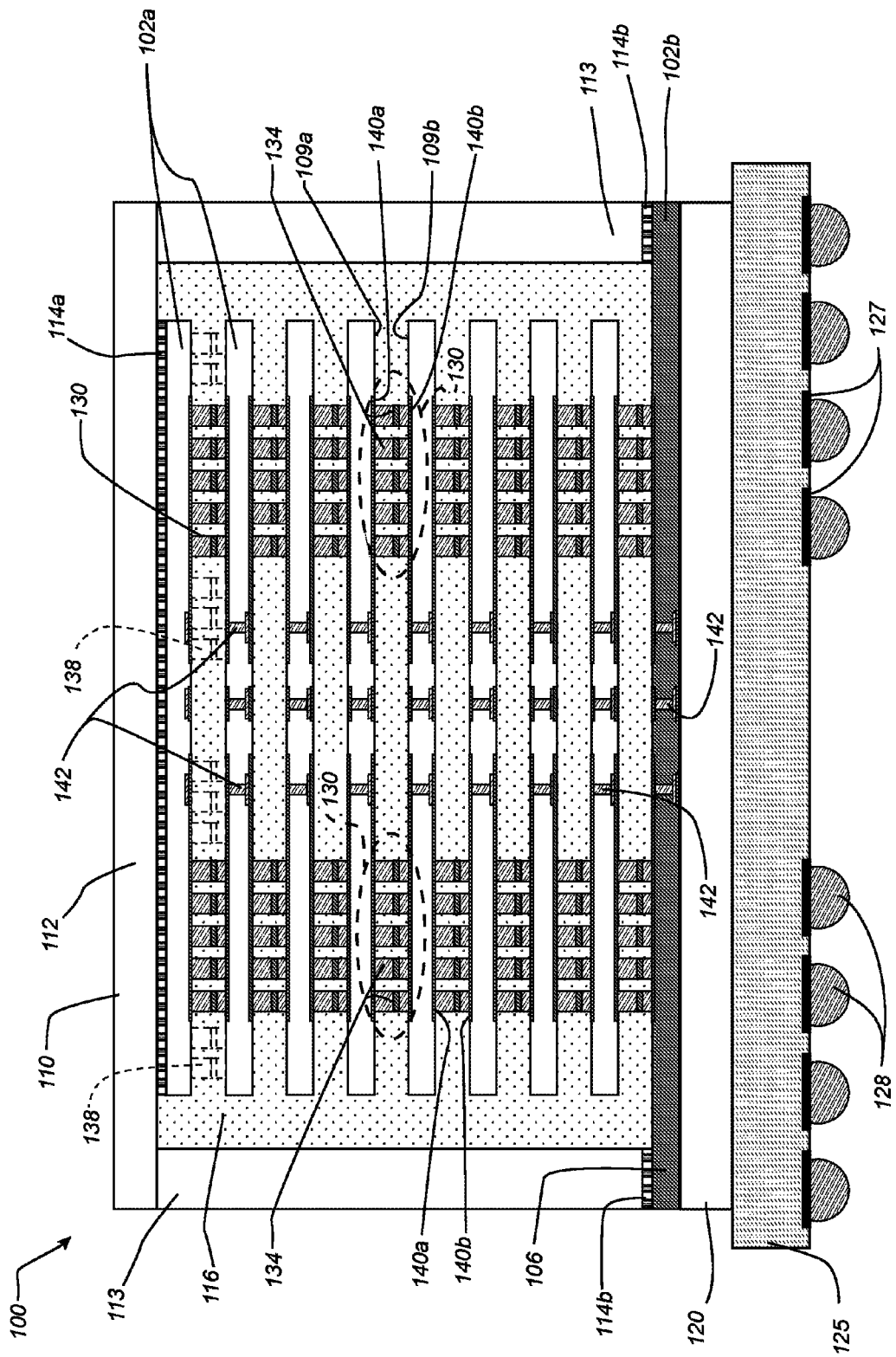
FIG. 1 is a cross-sectional view of a semiconductor die assembly configured in accordance with an embodiment of the present technology.

FIG. 1 is a cross-sectional view of a semiconductor die assembly 100 ("assembly 100") configured in accordance with an embodiment of the present technology. The assembly 100 includes a stack of first semiconductor dies 102a carried by a second semiconductor die 102b (collectively "semiconductor dies 102"). The second semiconductor die 102b, in turn, is carried by an interposer 120. The interposer 120 can include, for example, a semiconductor die, a dielectric spacer, and/or another suitable substrate having electrical connectors (not shown), such as vias, metal traces, etc.) connected between the interposer 120 and a package substrate 125. The package substrate 125 can include, for example, an interposer, a printed circuit board, another logic die, or another suitable substrate connected to package contacts 127 (e.g., bond pads) and electrical connectors 128 (e.g., solder balls) that electrically couple the assembly 100 to external circuitry (not shown). In some embodiments, the package substrate 125 and/or the interposer 120 can be configured differently. For example, in some embodiments the interposer 120 can be omitted and the second semiconductor die 102b can be directly connected to the package substrate 125.

The assembly 100 can further include a thermally conductive casing 110 ("casing 110"). The casing 110 can include a cap portion 112 and a wall portion 113 attached to or integrally formed with the cap portion 112. The cap portion 112 can be attached to the top-most first semiconductor die 102a by a first bond material 114a (e.g., an adhesive). The wall portion 113 can extend vertically away from the cap portion 112 and be attached to a peripheral portion 106 of the first semiconductor die 102a (known to those skilled in the art as a "porch" or "shelf") by a second bond material 114b (e.g., an adhesive). In addition to providing a protective covering, the casing 110 can serve as a heat spreader to absorb and dissipate thermal energy away from the semiconductor dies 102. The casing 110 can accordingly be made from a thermally conductive material, such as nickel (Ni), copper (Cu), aluminum (Al), ceramic materials with high thermal conductivities (e.g., aluminum nitride), and/or other suitable thermally conductive materials.

In some embodiments, the first bond material 114a and/or the second bond material 114b can be made from what are known in the art as "thermal bond materials" or "TIMs", which are designed to increase the thermal contact conductance at surface junctions (e.g., between a die surface and a heat spreader). TIMs can include silicone-based greases, gels, or adhesives that are doped with conductive materials (e.g., carbon nano-tubes, solder materials, diamond-like carbon (DLC), etc.), as well as phase-change materials. In other embodiments, the first bond material 114a and/or the second bond material 114b can include other suitable materials, such as metals (e.g., copper) and/or other suitable thermally conductive materials.

Some or all of the first and/or second semiconductor dies 102 can be at least partially encapsulated in a dielectric underfill material 116. The underfill material 116 can be deposited or otherwise formed around and/or between some or all of the dies to enhance a mechanical connection with a die and/or to provide electrical isolation between conductive features and/or structures (e.g., interconnects). The underfill material 116 can be a non-conductive epoxy paste, a capillary underfill, a non-conductive film, a molded underfill, and/or include other suitable electrically-insulative materials. In several embodiments, the underfill material 116 can be selected based on its thermal conductivity to enhance heat dissipation through the dies of the assembly 100. In some embodiments, the underfill material 116 can be used in lieu the first bond material 114a and/or the second bond material 114b to attach the casing 110 to the top-most first semiconductor die 102a The semiconductor dies 102 can each be formed from a semiconductor substrate, such as silicon, silicon-on-insulator, compound semiconductor (e.g., Gallium Nitride), or other suitable substrate. The semiconductor substrate can be cut or singulated into semiconductor dies having any of variety of integrate circuit components or functional features, such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a hybrid memory cube (HMC) in which the first semiconductor dies 102a provide data storage (e.g., DRAM dies) and the second semiconductor die 102b provides memory control (e.g., DRAM control) within the HMC. In some embodiments, the assembly 100 can include other semiconductor dies in addition to and/or in lieu of one or more of the semiconductor dies 102. For example, such semiconductor dies can include integrated circuit components other than data storage and/or memory control components. Further, although the assembly 100 includes nine dies stacked on the interposer 120, in other embodiments the assembly 100 can include fewer than nine dies (e.g., six dies) or more than nine dies (e.g., twelve dies, fourteen dies, sixteen dies, thirty-two dies, etc.). For example, in one embodiment, the assembly 100 can include four memory dies stacked on two logic dies. Also, in various embodiments, the semiconductor dies 102 can have different sizes.

For example, in some embodiments the second semiconductor die 102b can have the same footprint as at least one of the first semiconductor dies 102a.

As further shown in FIG. 1, the assembly 100 further includes a plurality of first conductive traces 140a ("first traces 140a") on a first side 109a (e.g., front side) of the semiconductor dies 102, a plurality of second conductive traces 140b ("second traces 140b") on a second side 109b (e.g., a back side) of the semiconductor dies 102, and a plurality of interconnect structures 130 intercoupling individual first traces 140a with individual second traces 140b. Each of the first and second traces 140a and 140b can include, for example, a conductive line, a conductive plate, or other conductive structure that extends laterally across one side of the semiconductor dies 102. In the illustrated embodiment, the first and second traces 140a and 140b are coupled to corresponding through-substrate vias (TSVs) 142. The TSVs are configured to intercouple the first and second traces 140a and 140b at opposite sides of the semiconductor dies 102. As shown, the TSVs 142 can be disposed toward the center of the semiconductor dies 102, and the first and second traces 140a and 140b can fan outwardly from the TSVs 142 and toward the interconnect structures 130. In other embodiments, however, the TSVs 142, the first and second traces 140a and 140b, and/or the interconnect structures 130 can be arranged differently.

The interconnect structures 130 can each include a plurality of redundant electrical connectors 134 ("redundant connectors 134") coupled between individual first traces 140a and individual second traces 140b of adjacent semiconductor dies 102. As such, each pair of first and second traces 140a and 140b is electrically and thermally coupled together by a plurality of the redundant connectors 134. In one aspect of this embodiment, the redundant connectors 134 can improve process yield during manufacturing. For example, as described in greater detail below, the individual structures 130 are less prone to open circuit relative to conventional interconnects or other electrical connectors because there are a plurality of redundant connectors spaced apart from each other along the traces 140a and 140b. In another aspect of this embodiment, the redundant connectors 134 can enhance thermal conduction through the stack of semiconductor dies 102 and toward the cap portion 112 of the casing 110. In particular, the redundant connectors 134 can provide multiple heat transfer paths between adjacent semiconductor dies 102. In several embodiments, the redundant connectors 134 can be spaced apart from one another along the individual traces 140a and 140b to distribute heat laterally across the semiconductor dies 102. In additional or alternate embodiments, additional redundant electrical connectors 138 (shown in hidden lines) can extend between interior portions (e.g., between the TSVs 142) and/or outer portions (e.g., toward the edges of the dies 102) of the semiconductor dies 102 to further distribute heat.

Figure 2A:
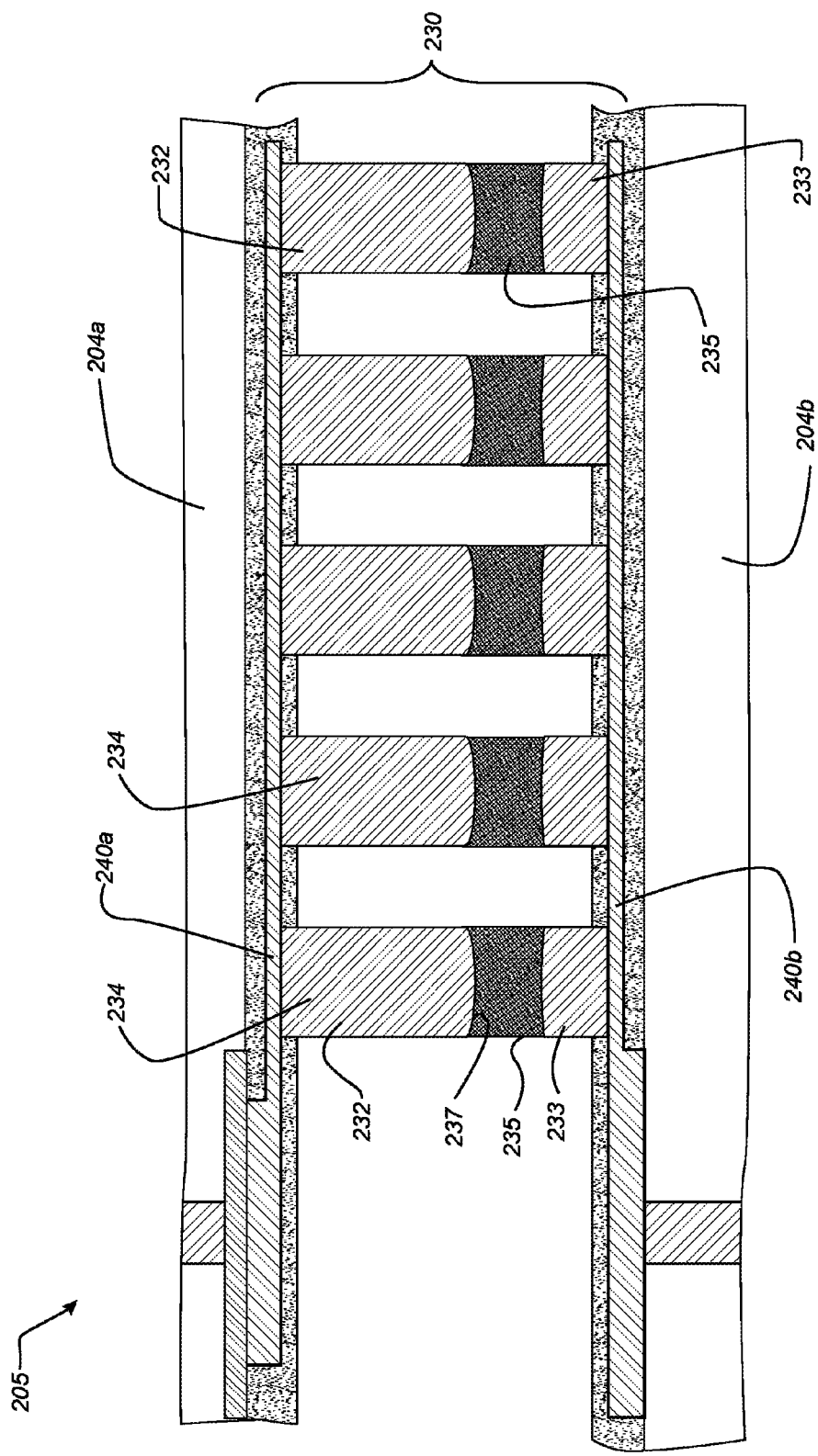
FIG. 2A is an enlarged cross-sectional view of a semiconductor device that includes an interconnect structure configured in accordance with an embodiment of the present technology.

FIG. 2A is an enlarged view of a semiconductor device 205 having an interconnect structure 230 configured in accordance with an embodiment of the present technology. As shown, the interconnect structure 230 includes a plurality of redundant electrical connectors 234 ("redundant connectors 234") extending between a first semiconductor substrate 204a (e.g., a semiconductor wafer or die) and a second semiconductor substrate 204b (e.g., a semiconductor wafer or die). Each of the redundant connectors 234 includes a conductive member, or pillar 232, coupled to a first conductive film, or first trace 240a, of the first substrate 204a. The redundant connectors 234 also include a second conductive member, or bond pad 233 (e.g., a raised bond pad)

coupled to a second conductive film, or second trace 240b, on the second substrate 204b. A conductive bond material 235 can form a conductive joint that couples the bond pad 233 to an end portion 237 of a corresponding pillar 232. The conductive bond material 235 can include, for example, solder (e.g., metal solder), a conductive epoxy, or a conductive paste.

Figure 2B:
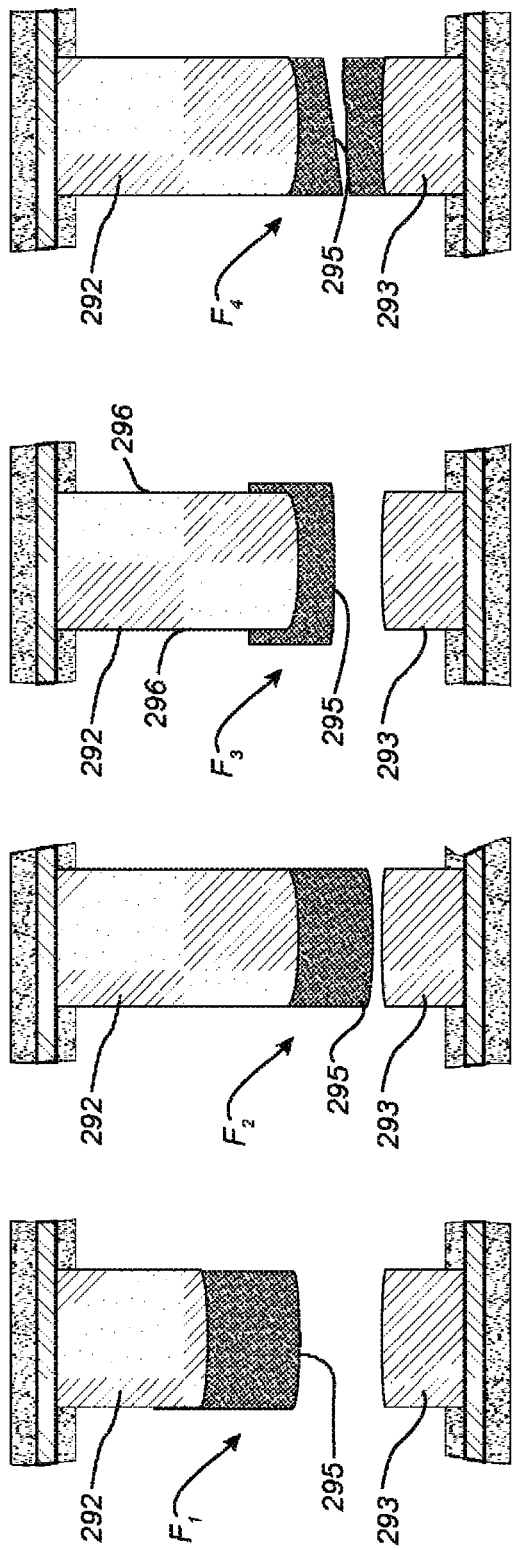
FIG. 2B is a cross-sectional view illustrating certain failure modes of solder bonds that can occur during manufacturing.

In general, one challenge with solder bond materials is that they can fail to properly bond an interconnect to a bond pad. FIG. 2B, for example, shows several failure modes of a solder bond material 295. A first failure mode $F_1$ occurs when an interconnect 292 has a smaller height relative to the height of adjacent interconnects (not shown). In this failure mode, the larger gap between the interconnect 292 and its corresponding bond pad 293 prevents the bond material 295 from contacting the bond pad 293. A second failure mode $F_2$ occurs when residual contamination (not shown) on the interconnect 292 and/or the bond pad 293 prevents the bond material 295 from wetting to the interconnect 292 and/or the bond pad 293. A third failure mode $F_3$ can be attributed to solder wicking that occurs during reflow or other heating processes. In particular, solder wicking occurs when surface tension draws the (heated) bond material 295 toward sidewalls 296 of the interconnect 292 and away from the bond pad 293. A fourth failure mode $F_4$ involves the cracking or breakage of the bond material 295 between the interconnect 292 and the bond pad 293. Cracking can occur, for example, when a solder material consumes (i.e., reacts with) certain materials of an interconnect (e.g., palladium (Pd)) and causes the bond material 295 to become brittle and prone to breakage.

Interconnect structures configured in accordance with several embodiments of the present technology, however, can address these and other limitations of conventional interconnects and related structures. Referring again to FIG. 2A, the redundant connectors 234 are configured such that even if certain connectors 234 fail (e.g., by one of the failure modes $F_1$-$F_4$), the interconnect structure 230 will not fail so long as at least one of the other redundant connectors 234 remains connected to the first and second traces 240a and 240b. In the embodiment shown in FIG. 2A, for example, up to four of the redundant connectors 234 can fail without open circuiting the interconnect structure 230. In other embodiments, the interconnect structure 230 can have a different number of redundant connectors, such as more than five redundant connectors (e.g., 6, 8, 10, or more connectors) or less than 5 redundant connectors (e.g., 2, 3, or 4 connectors). In several embodiments, the number of redundant connectors can be selected to improve an expected process yield during manufacturing. For example, in some instances an interconnect structure having three redundant connectors may increase process yield by 0.5%, while four redundant connectors may only increase yield by an additional 0.05%. In such a scenario, the three-connector configuration may be an acceptable design over the four-connector configuration because the expected difference in process yield may be negligible.

Another advantage of the interconnect structures of the various embodiments is that the redundant electrical connectors can reduce the current density through a conductive joint (e.g., through the bond material 235 of the redundant interconnects 234). For example, an interconnect structure having ten redundant connectors can have about a ten-fold reduction in current density through each of its conductive joints. A related advantage is that the lower current density can reduce electromigration. For example, a lower current density can reduce electromigration through tin/silver-based (SnAg) solder joints, which are typically much more susceptible to electromigration than other interconnect materials (e.g., copper). In some embodiments, the number of redundant electrical connectors can be selected to achieve a certain reduction in electromigration balanced against a potential increase in capacitance across the interconnect structure.

Figure 3:
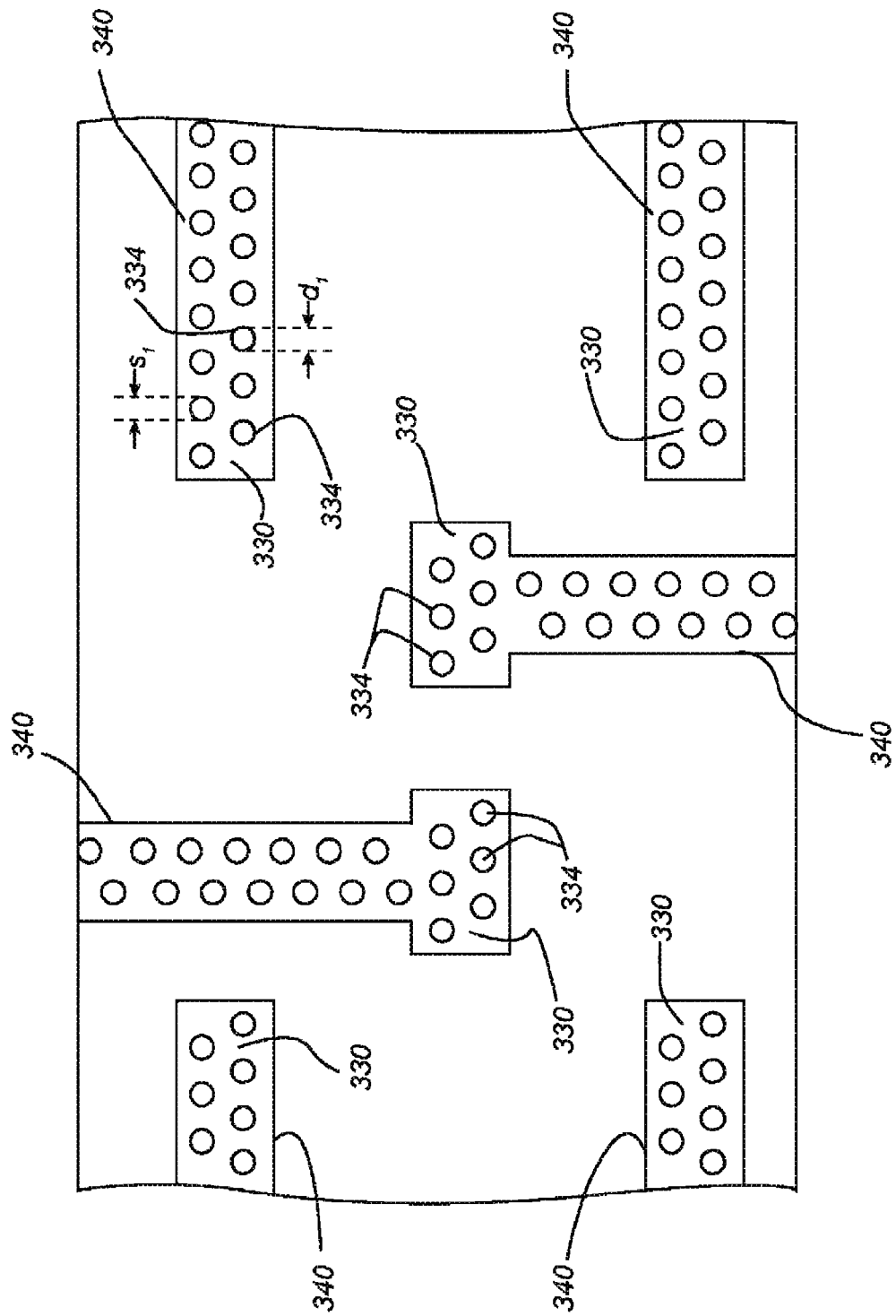
FIG. 3 is a top plan view showing interconnect structures configured in accordance with another embodiment of the present technology.

A further advantage of the interconnect structures of the various embodiments is that the redundant electrical connectors can be closely packed. FIG. 3, for example, is a top plan view showing closely packed redundant electrical connectors 334 ("redundant connectors 334") of corresponding interconnect structures 330 configured in accordance with another embodiment of the present technology. As shown, the redundant connectors 334 are each formed on a conductive trace 340 of a corresponding interconnect structure 330. The redundant connectors 334 each have a diameter $d_1$ and are spaced apart from one another by a spacing distance $s_1$. In one embodiment, the size of the diameter $d_1$ can be approximately the same as the spacing distance $s_1$. In another embodiment, the spacing distance $s_1$ can be smaller than the diameter $d_1$. For example, the spacing distance $s_1$ can be less than 75% of $d_1$, less than 50% of $d_1$, or less than 25% of $d_1$. Conventional interconnects, by contrast, cannot be closely packed in such a manner because there is a risk that metal solder may bridge the interconnects and cause electrical shorting. However, because the redundant connectors 334 are electrically coupled to one another (i.e., via the conductive traces 340), electrical shorting does not pose such a risk.

Figure 4A:
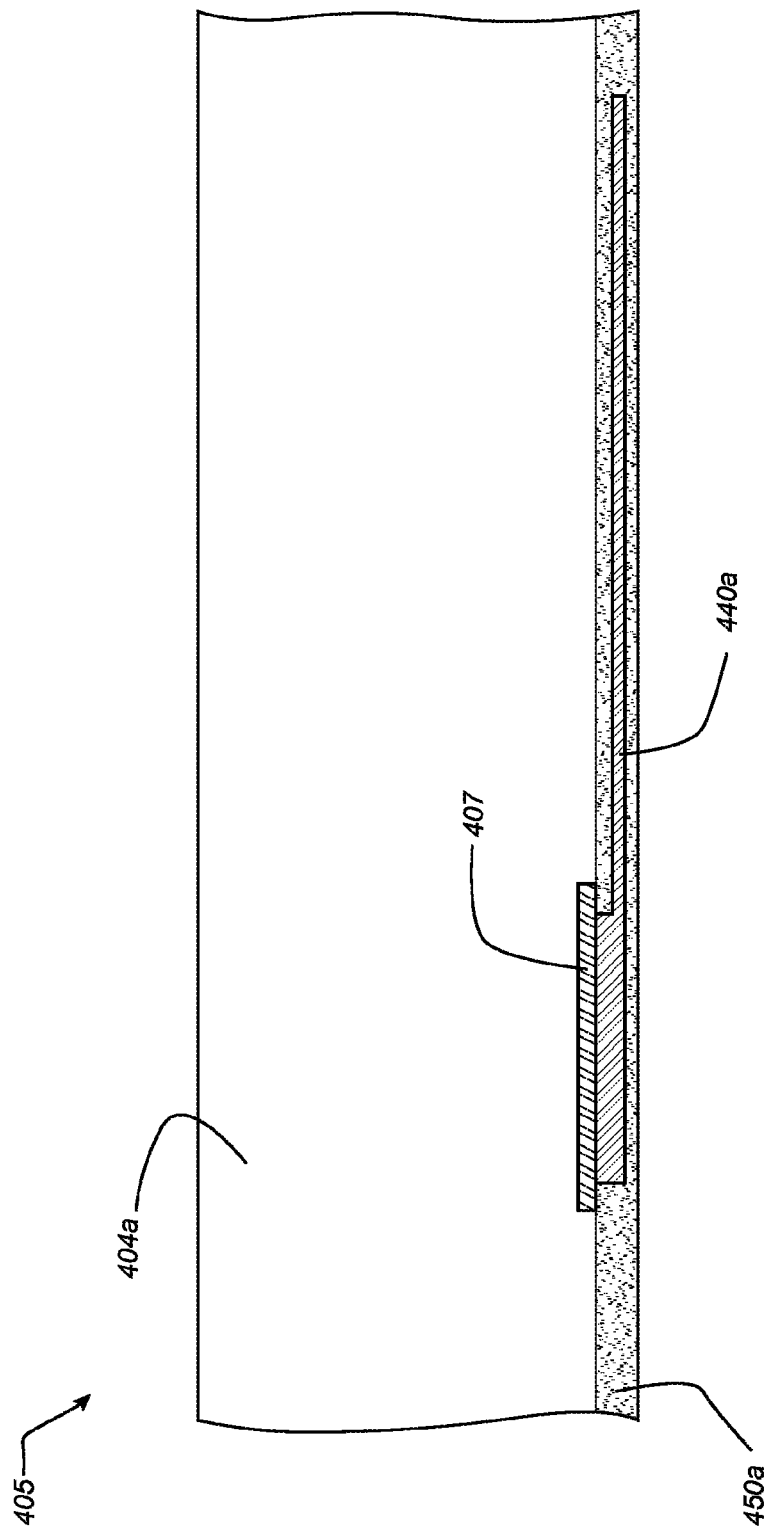

FIGS. 4A-4H are cross-sectional views illustrating a portion of a semiconductor device 405 at various stages in a method for making interconnect structures in accordance with selected embodiments of the present technology. Referring first to FIG. 4A, the semiconductor device 405 includes a first substrate 404a (e.g., a silicon wafer or die) and a first dielectric material 450a (e.g., silicon oxide) formed thereon. The first dielectric material 450a is patterned to expose a substrate contact 407 (e.g., a copper bond pad). The first dielectric material 450a can also be patterned to expose other substrate contacts of the first substrate 404a (not shown), such as substrate contacts connected to an integrated circuit (IC) device (e.g., memory; not shown) of the first substrate 404a. The semiconductor device 405 further includes a patterned first conductive film, or first conductive trace 440a (e.g., a copper or copper alloy film), formed on the first dielectric material 450a and the substrate contact 407.

FIG. 4B shows the semiconductor device 405 after forming a mask 460 (e.g., a photoresist mask, hard mask, etc.) and openings 452 in the first dielectric material 450a. The openings 452 can be formed by removing (e.g., etching) portions of the first dielectric material 450a through corresponding mask openings 461. As shown in FIG. 4B, the openings 452 can expose portions of the underlying first conductive trace 440a.

Figure 4C:
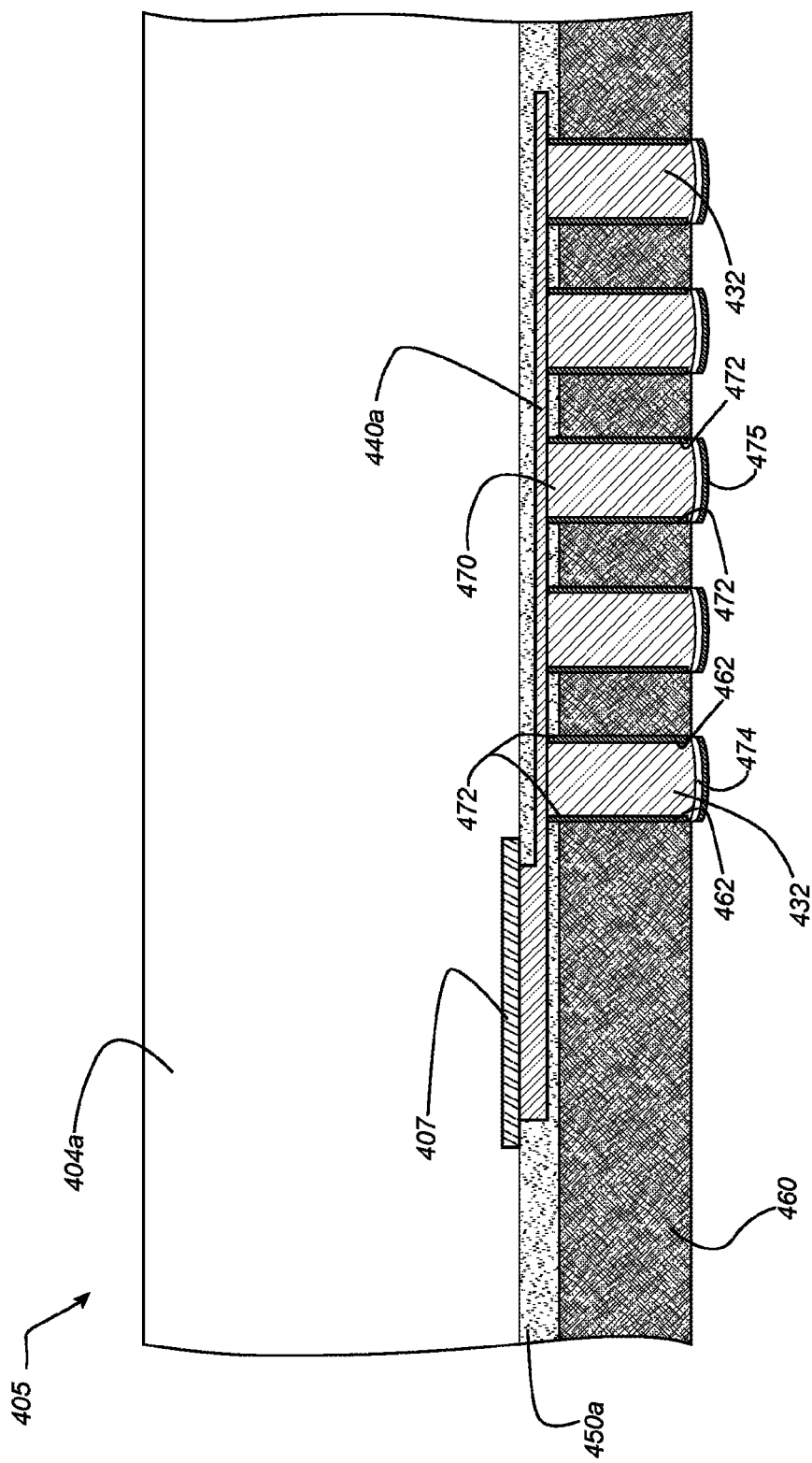

FIG. 4C shows the semiconductor device 405 after forming conductive members, or pillars 432, on the first conductive trace 440a. In several embodiments, the pillars 432 can be formed by depositing a seed material 472 (e.g., copper) on sidewalls 462 of the mask openings 461 (FIG. 4B) and/or the first conductive trace 440a followed by electroplating a conductive material 470 (e.g., copper) onto the seed material 472. In the illustrated embodiment, a barrier material 474 (e.g., nickel) and an interface material 475 (e.g., palladium) can also be electroplated in sequence onto the conductive material 472. In other embodiments, other deposition techniques, such as sputter deposition, can be used in lieu of electroplating.

Figure 4D:
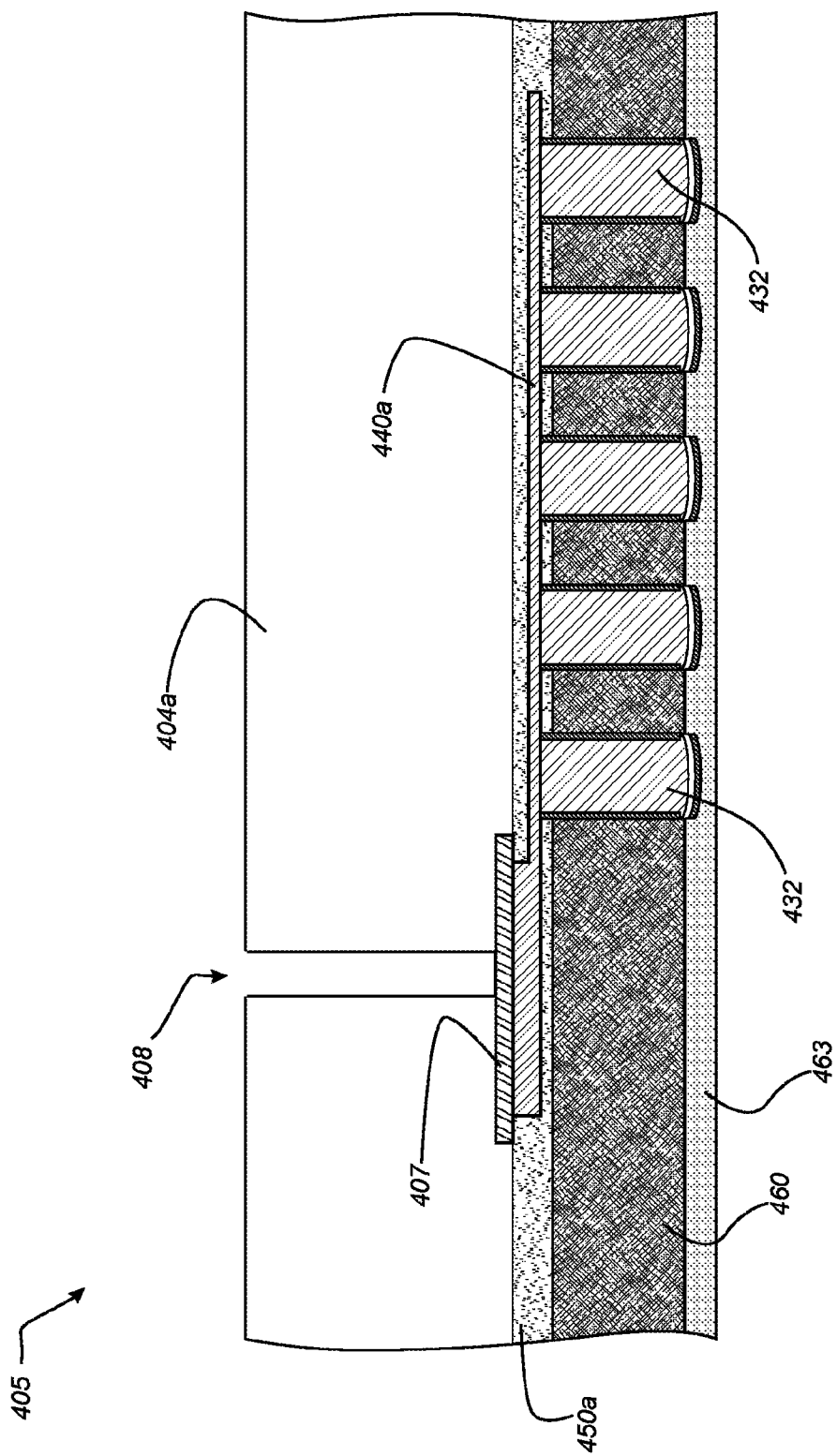

FIG. 4D shows the semiconductor device 405 after forming an opening 408 in the first substrate 404a and forming a protective material 463 over the pillars 432. As shown, the opening 408 extends through the first substrate 404a and exposes a portion of the substrate contact 407 toward the base of the opening 408. In several embodiments, the opening 408 can be formed by first thinning the first substrate 404a (e.g., via etching, backgrinding, etc.) and then removing substrate material (e.g., via an etch). In the illustrated embodiment, the protective material or film 463 (e.g., a polymeric film) can protect the pillars 432 during manufacturing.

Figure 4E:
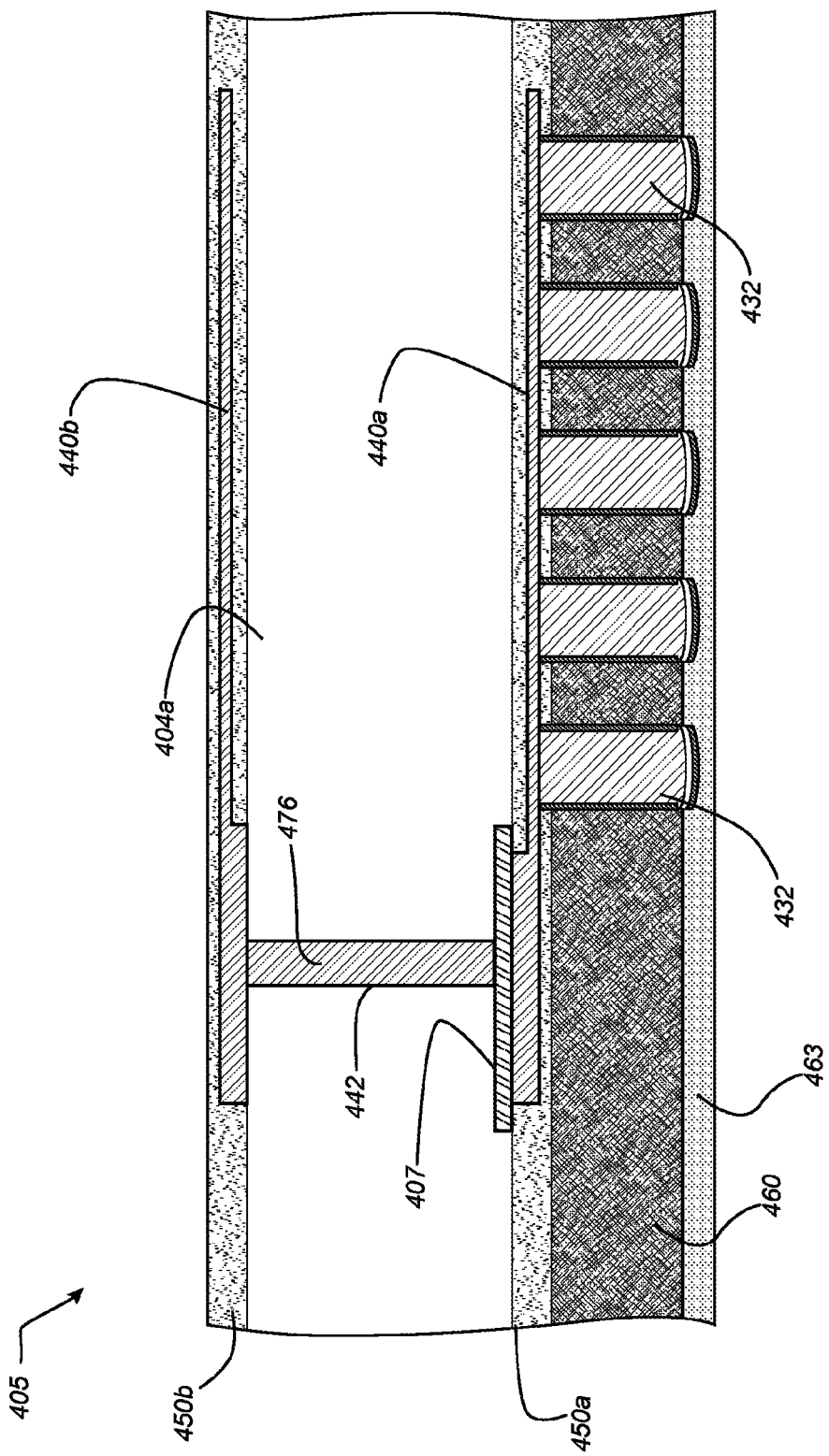

FIG. 4E shows the semiconductor device 405 after forming a TSV 442, a second dielectric material 450b, and a second conductive film, or second conductive trace 440b. The TSV 442 can be formed by filling the opening 408 (FIG. 4D) in the first substrate 404a with a conductive material 476, such as copper or copper alloy. In several embodiments, the second conductive trace 440b and the second dielectric material 450b can be formed in a manner similar to that of the first conductive trace 440a and the first dielectric material 450a.

Figure 4F:
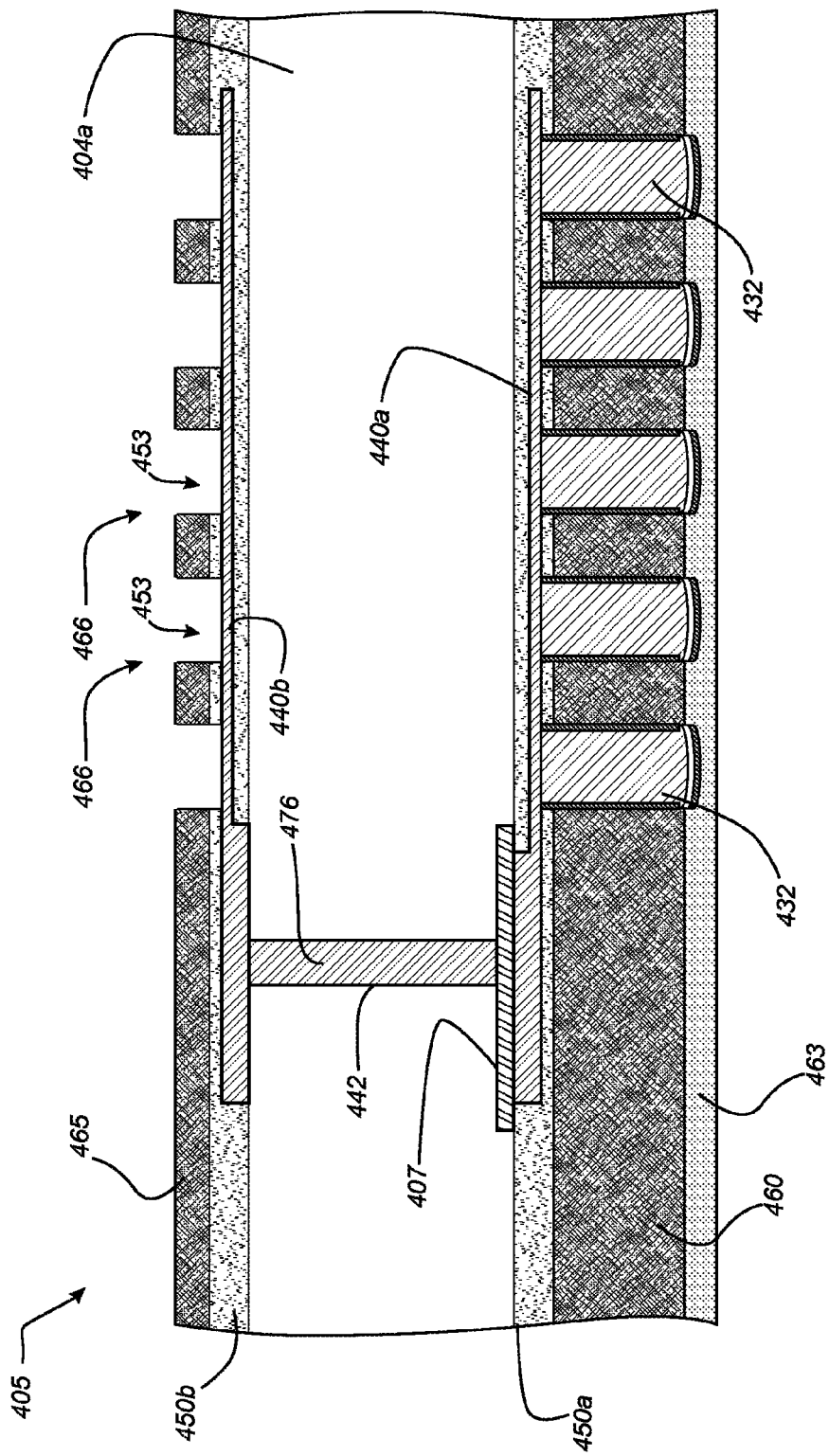

FIG. 4F shows the semiconductor device 405 after forming a mask 465 and openings 453 in the second dielectric material 450b. The openings 453 can be formed by removing (e.g., etching) portions of the second dielectric material 450b through corresponding mask openings 466. As shown in FIG. 4F, the openings 453 in the second dielectric material 450b can expose portions of the underlying second conductive trace 440b.

Figure 4G:
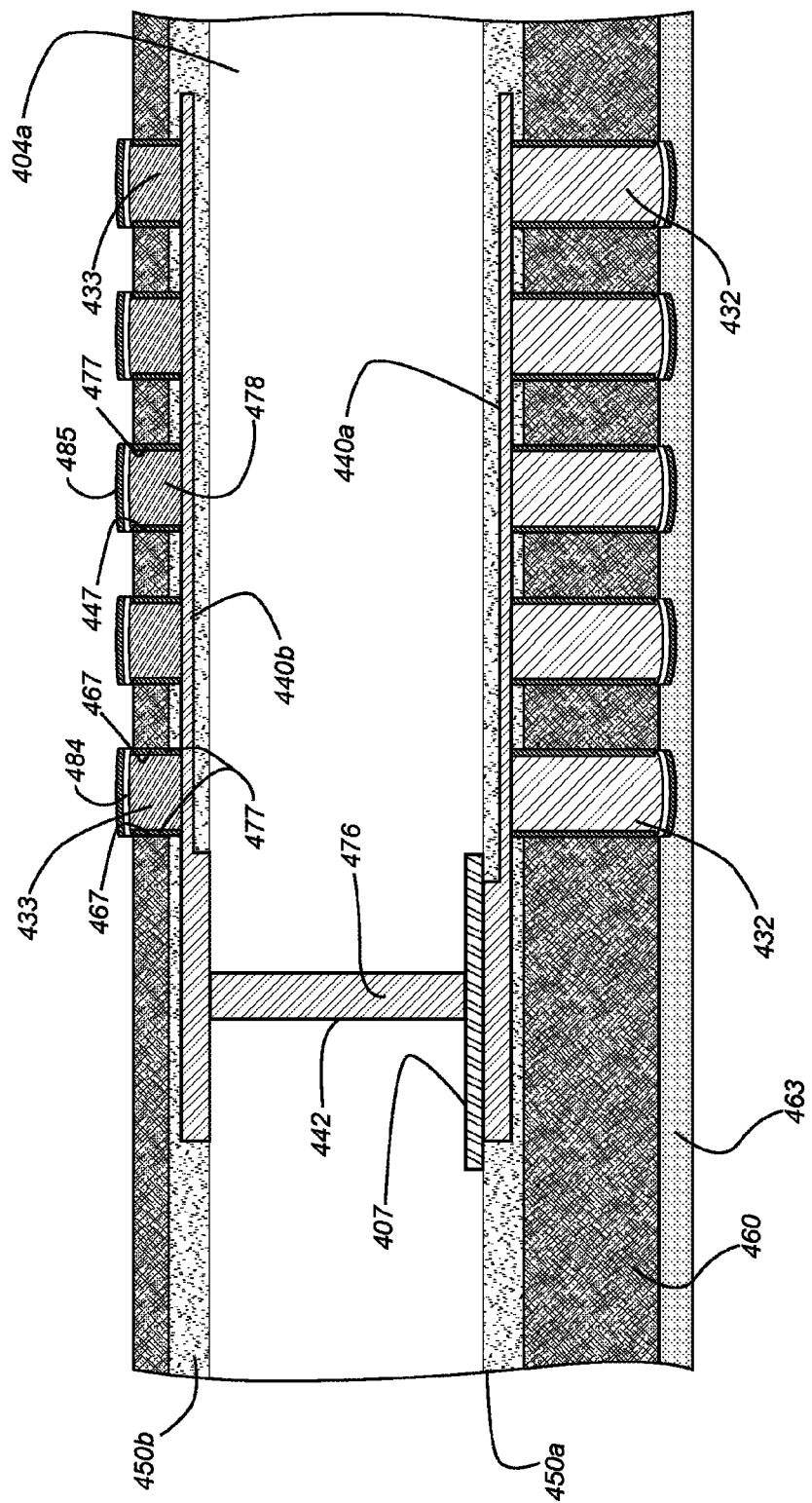

FIG. 4G shows the semiconductor device 405 after forming conductive members, or bond pads 433, on the second conductive trace 440b. Similar to the pillars 432, the bond pads 433 can be formed by depositing a seed material 477 (e.g., copper) onto sidewalls 467 of the mask openings 466 (FIG. 4F) and/or the second conductive trace 440b followed by electroplating a conductive material 478 (e.g., copper) onto the seed material 477. In some embodiments, the bond pads 432 can include a barrier material 484 (e.g., nickel) and an interface material 485 (e.g., palladium) that is electroplated in sequence onto the conductive material 478.

Figure 4H:
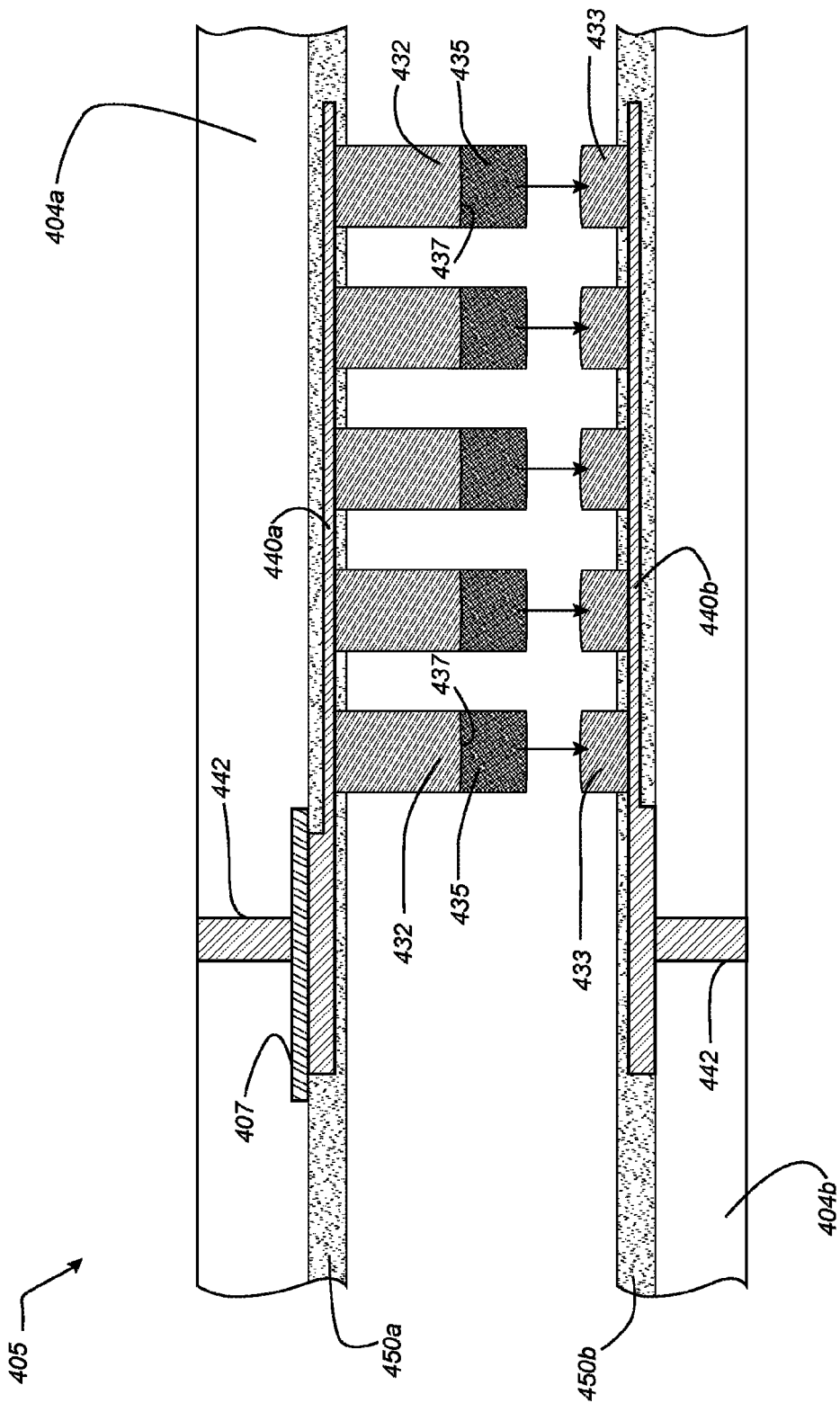

FIG. 4H shows the semiconductor device 405 after removing the mask 465 and the protective film 463 (FIG. 4G) and forming a bond material 435 (e.g., metal solder) on end portions 437 of the pillars 432. In one embodiment, the bond material 435 can be an electroplated material. In another embodiment, the bond material 435 can be in the form of a solder ball. In either case, the bond material 435 can be heated (e.g., reflowed) and brought into contact with corresponding bond pads 433 of a second substrate 404b. After reflow, the bond material 436 can be allowed to cool and solidify into conductive joints that attach the pillars 432 to the bond pads 433. In several embodiments, the bond pads 433 can be generally similar in structure and function to the bond pads 433 of the first substrate 404a (FIG. 4G).

Figure 5:
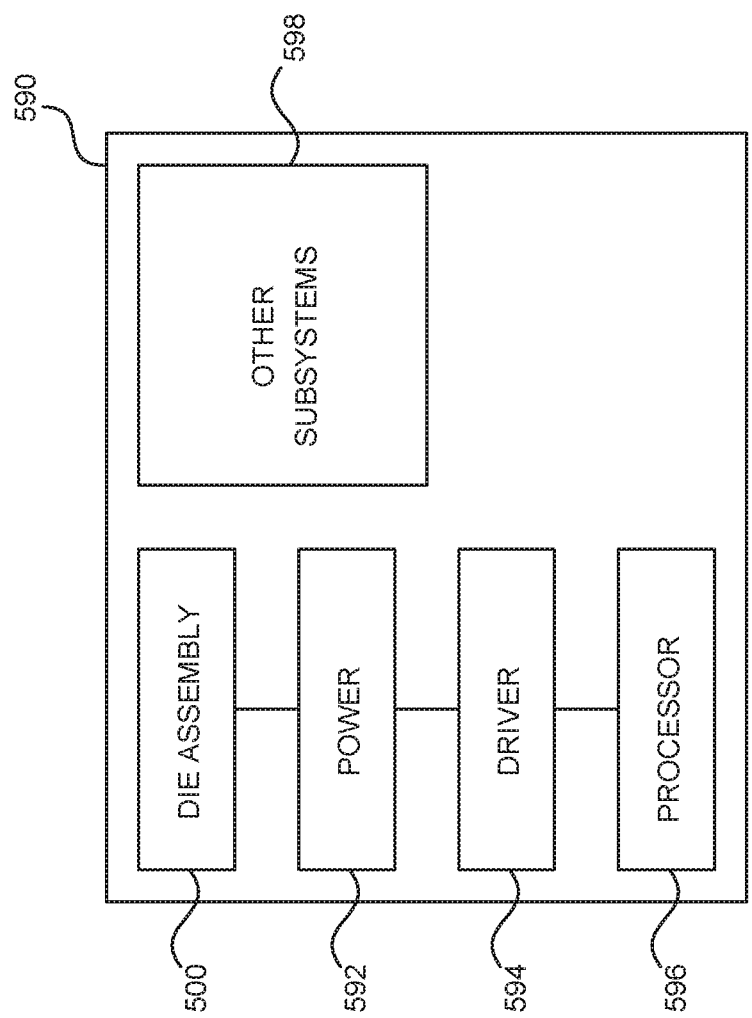
FIG. 5 is a schematic view of a system that includes a semiconductor die assembly configured in accordance with embodiments of the present technology.

Any one of the interconnect structures and/or semiconductor die assemblies described above with reference to FIGS. 1-4H can be incorporated into any of a myriad of larger and/or more complex systems, a representative example of which is system 590 shown schematically in FIG. 5. The system 590 can include a semiconductor die assembly 500, a power source 592, a driver 594, a processor 596, and/or other subsystems or components 598. The semiconductor die assembly 500 can include features generally similar to those of the stacked semiconductor die assemblies described above, and can therefore include various features that enhance heat dissipation. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, and appliances. Components of the system 590 may be housed in a single unit or distributed over multiple, interconnected units (e.g., through a communications network). The components of the system 590 can also include remote devices and any of a wide variety of computer readable media.

From the foregoing, it will be appreciated that specific embodiments of the technology have been described herein for purposes of illustration, but that various modifications may be made without deviating from the disclosure. For example, although several of the embodiments of the semiconductor dies assemblies are described with respect to HMCs, in other embodiments the semiconductor die assemblies can be configured as other memory devices or other types of stacked die assemblies. In addition, while in the illustrated embodiments certain features or components have been shown as having certain arrangements or configurations, other arrangements and configurations are possible. For example, while the TSV 442 (FIG. 4E) in the illustrated embodiment is formed after front-end metallization (i.e., after forming the substrate contact 407), in other embodiments the TSV 442 can be formed before or concurrently with front-end metallization. Also, while the pillars in the illustrated embodiments are bonded to raised pads, in other embodiments the pillars can be bonded to other structures or directly to a conductive trace. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A method of forming a semiconductor die assembly, the method comprising:
   forming a first conductive film on a first semiconductor die;
   forming a second conductive film on a second semiconductor die;
   forming a plurality of redundant electrical connectors on the first conductive film such that each of the redundant electrical connectors is electrically coupled to each of the other redundant electrical connectors via the first conductive film; and
   coupling the redundant electrical connectors to the second conductive film.

2. The method of claim 1 wherein coupling the redundant electrical connectors to the second conductive film includes forming a solder bond between each of the redundant electrical connectors and the second conductive film.

3. The method of claim 1 wherein coupling the redundant electrical connectors to the second conductive film includes forming a solder bond between each of the redundant electrical connectors and a corresponding bond pad on the second conductive film.

4. A method of forming a semiconductor die assembly, the method comprising:

forming a first conductive film on a first semiconductor die;

forming a second conductive film on a second semiconductor die;

forming a plurality of redundant electrical connectors on the first conductive film; and coupling the redundant electrical connectors to the second conductive film by forming a solder bond between each of the redundant electrical connectors and the second conductive film, wherein the solder bond of at least one of the redundant electrical connectors fails to electrically connect at least one of the redundant electrical connectors with a corresponding one of the bond pads.

5. The method of claim 3, further comprising forming a through-substrate via (TSV) that extends through a substrate of the first semiconductor die, wherein forming the first conductive film further includes coupling the TSV to the first conductive film.

6. The method of claim 1 wherein:

forming the first conductive film includes forming a first conductive trace; and forming the second conductive film includes forming a second conductive trace.

7. A method of forming a semiconductor die assembly, comprising:

forming a first conductive trace on a first semiconductor die;

forming a plurality of conductive members on the first conductive trace such that the conductive members are electrically coupled to the other conductive members via the first conductive trace, wherein the conductive members project away from the first semiconductor die;

disposing a conductive bond material on each of the conductive members; and reflowing the conductive bond material to couple individual ones of the plurality of conductive members to a second conductive trace of a second semiconductor die.

8. The method of claim 7 wherein disposing the conductive bond material includes disposing metal solder on each of the conductive members.

9. A method of forming a semiconductor die assembly, comprising:

forming a first conductive trace on a first semiconductor die;

forming a plurality of conductive members on the first conductive trace that project away from the first semiconductor die;

disposing a conductive bond material on each of the conductive members; and reflowing the conductive bond material to couple individual ones of the plurality of conductive members to a second conductive trace of a second semiconductor die, wherein after reflowing the conductive bond material, the conductive bond material on at least one of the conductive members fails to form a solder joint with the second conductive trace.

10. The method of claim 7 wherein reflowing the conductive bond material includes reflowing the conductive bond material between bond pads on the conductive second trace and corresponding ones of the conductive members.

11. The method of claim 7 wherein forming the conductive members includes forming a plurality of conductive pillars on the first conductive trace.

12. The method of claim 7 wherein:

the first semiconductor die includes a substrate and a through-substrate via (TSV) extending through the substrate;

the first trace extends laterally away from the TSV; and forming the conductive members includes forming one or more the conductive members between the TSV and the second trace.

13. The method of claim 1 wherein forming the second conductive film includes forming the second conductive film on a dielectric material over the second semiconductor die, wherein the dielectric material at least partially surrounds the second semiconductor die.

14. The method of claim 1 wherein the redundant electrical connectors extend at least partially through a dielectric material formed over the first semiconductor die.

15. The method of claim 1 wherein the plurality of redundant electrical connectors are formed directly on the first conductive film.

16. The method of claim 7 wherein the first conductive trace is formed on a dielectric material that is over and at least partially surrounds the first semiconductor die.

17. The method of claim 7 wherein the conductive members formed on the first conductive trace extend at least partially through a dielectric material formed over the first semiconductor die.

18. The method of claim 7 wherein the conductive members are formed directly on the first conductive trace film.

* * * * *